(12) United States Patent
Abe et al.

(10) Patent No.: US 6,979,774 B2
(45) Date of Patent: Dec. 27, 2005

(54) CABLE MODEM MODULE AND TRANSMITTER-RECEIVER

(75) Inventors: Shuji Abe, Kumagaya (JP); Katsuya Kudo, Fukaya (JP); Tsutomu Isoda, Takasaki (JP); Masami Oosawa, Kumagaya (JP); Mikine Fujihara, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/860,788

(22) Filed: Jun. 4, 2004

(65) Prior Publication Data

US 2004/0248436 A1 Dec. 9, 2004

(30) Foreign Application Priority Data

Jun. 6, 2003 (JP) ............................. 2003-162631

(51) Int. Cl.⁷ .............................................. H05K 9/00
(52) U.S. Cl. ............................. 174/35 GC; 174/35 R; 361/816; 361/752
(58) Field of Search ..................... 174/35 R, 35 GC; 361/816, 818, 800, 752

(56) References Cited

U.S. PATENT DOCUMENTS

| | | | | |
|---|---|---|---|---|
| 4,455,448 A | * | 6/1984 | Bertolina ................... | 174/35 R |
| 4,685,034 A | * | 8/1987 | Tetsu et al. ................. | 361/818 |
| 5,635,754 A | * | 6/1997 | Strobel et al. .............. | 257/659 |
| 5,696,669 A | * | 12/1997 | Bassler et al. .............. | 361/816 |
| 5,970,055 A | | 10/1999 | Park et al. | |
| 6,011,700 A | * | 1/2000 | Matsuzaki ................. | 361/816 |
| 6,118,672 A | * | 9/2000 | Yamauchi et al. .......... | 361/818 |
| 2002/0056134 A1 | | 5/2002 | Abe et al. | |
| 2004/0246687 A1 | | 12/2004 | Abe et al. | |
| 2005/0003685 A1 | | 1/2005 | Abe et al. | |

FOREIGN PATENT DOCUMENTS

| | | |
|---|---|---|
| JP | 3-224295 | 10/1991 |
| JP | 8-32267 | 2/1996 |
| JP | 10-75082 | 3/1998 |
| JP | 11-103427 | 4/1999 |
| JP | 2002-16524 | 1/2002 |

* cited by examiner

*Primary Examiner*—Hung V. Ngo
(74) *Attorney, Agent, or Firm*—Pillsbury Winthrop Shaw Pittman, LLP

(57) ABSTRACT

A cable modem module including a first shield case configured to house a tuner unit, a first terminal used to input analog signals to the tuner unit and output the analog signals therefrom, a circuit board having the first terminal connected to it and configured to have a digital signal processing unit to digital process signals to be input to or output from the tuner unit, a second shield case configured to house the circuit board and the first shield case, and a plurality of second terminals each terminal having its one end connected to the circuit board and its other end passed through the second shield case to project to outside and configured to input or output digital signals to or from the digital signal processing unit, each of the second terminals being comprised of a through capacitor.

11 Claims, 11 Drawing Sheets

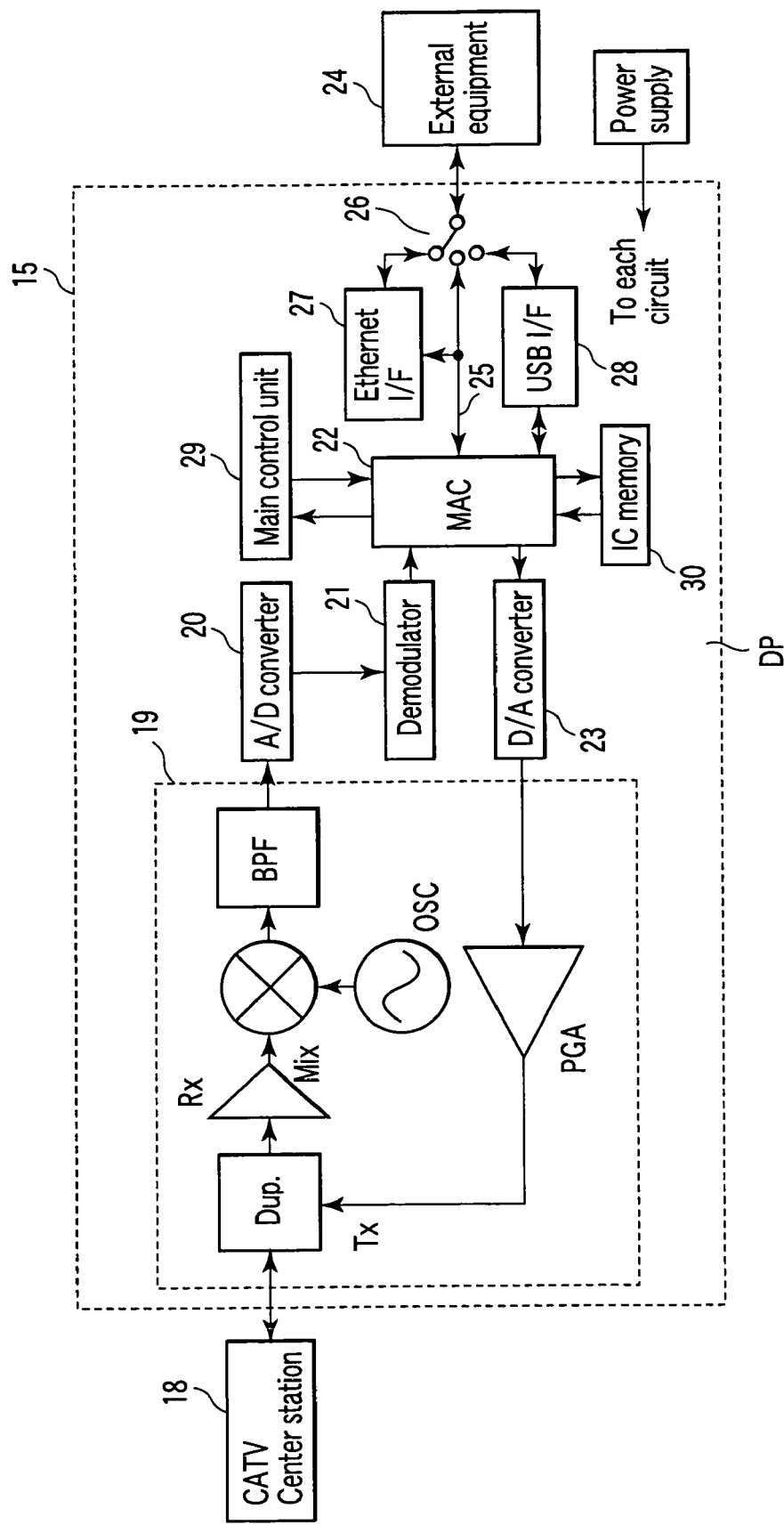
F I G. 2

CABLE MODEM MODULE AND TRANSMITTER-RECEIVER

CROSS-REFERENCE TO RELATED APPLICATIONS

This application is based upon and claims the benefit of priority from prior Japanese Patent Application No. 2003-162631, filed Jun. 6, 2003, the entire contents of which are incorporated herein by reference.

BACKGROUND OF THE INVENTION

1. Field of the Invention

The present invention relates to a cable modem module which serves as an interface with a network using a cable television (CATV) line, for example. The present invention also relates to a transmitter-receiver which makes data communications with the network via such a cable modem module as described above.

2. Description of the Related Art

As is well known, a cable modem device has been developed as an interface which connects a transmitter-receiver, such as a personal computer (PC), owned by a user to a network using a CATV line, for example. Such a cable modem device has been manufactured, separately from transmitter-receivers, as stand-alone equipment that a user can handle directly.

In general, the cable modem device is equipped on its back with a radio-frequency (RF) coaxial connector for connection to a CATV trunk line, an Ethernet connector or jack for connection to a PC or the like, a universal serial bus (USB) connector or jack, a reset switch to return the modem to its initial state, and a power supply connector to receive electric power.

The cable modem device is equipped on its front with a display unit, consisting of light emitting diodes or liquid crystal elements, which indicates whether electric power is supplied, whether connection with the CATV center station has been set up, whether connection with the PC has been set up, and the states of other functions, a power switch, and so on.

The cable modem device is housed in a case made of a synthetic resin material and has its shape determined according to whether it is to be placed in the neighborhood of a PC or to be hung on a wall.

Recent large-scale integration of semiconductor chips and enhanced performance and high-density packaging of parts have promoted cost reduction and size reduction of cable modem devices. In terms of size, therefore, it has become possible to incorporate a cable modem device into a transmitter-receiver.

However, since the cable modem device is originally constructed separately from the transmitter-receiver, incorporation of the cable modem device into the transmitter-receiver will require improvements in several respects.

Japanese Unexamined Patent Publication No. 2002-16524 discloses a transmission/reception radio-frequency device which has a transmitting-system block and a receiving-system block built into one case. However, this publication does not describe incorporation of the case with the built-in receiving-system and transmitting-system blocks into a transmitter-receiver.

BRIEF SUMMARY OF THE INVENTION

According to one aspect of the present invention, there is provided a cable modem module comprising: a tuner unit configured to have an analog signal processing unit to transmit and receive high-frequency signals; a first shield case configured to house the tuner unit; a first terminal used to input and output analog signals and configured such that its one end is connected to the tuner unit and its other end is passed through the first shield case to project to outside; a circuit board having the other end of the first terminal connected to it and configured to have a digital signal processing unit to digital process signals to be input to or output from the tuner unit; a second shield case configured to house the circuit board and the first shield case; and a plurality of second terminals each terminal having its one connected to the circuit board and its other end passed through the second shield case to project to outside and configured to input or output digital signals to or from the digital signal processing unit, each of the second terminals being comprised of a through capacitor.

According to another aspect of the present invention, there is provided a transmitter-receiver comprising: a cable modem module comprising a tuner unit configured to have an analog signal processing unit to transmit and receive high-frequency signals, a first shield case configured to house the tuner unit; a first terminal used to input and output analog signals and configured such that its one end is connected to the tuner unit and its other end is passed through the first shield case to project to outside; a circuit board having the other end of the first terminal connected to it and configured to have a digital signal processing unit to digital process signals to be input to or output from the tuner unit; a second shield case configured to house the circuit board and the first shield case; and a plurality of second terminals each terminal having its one connected to the circuit board and its other end passed through the second shield case to project to outside and configured to input or output digital signals to or from the digital signal processing unit, each of the second terminals being comprised of a through capacitor; and a power supply unit configured to supply electric power to the cable modem module, the cable modem module being operated from electric power supplied from the power supply unit to transmit or receive signals to or from outside.

BRIEF DESCRIPTION OF THE SEVERAL VIEWS OF DRAWING

FIG. 2 is a block diagram illustrating the signal processing system of a cable modem module in the CATV terminal device of FIG. 1;

FIG. 13 is a diagram illustrating another example of a transmitter-receiver having the cable modem module according to each of the embodiments built in.

DETAILED DESCRIPTION OF THE INVENTION

Figure 1:
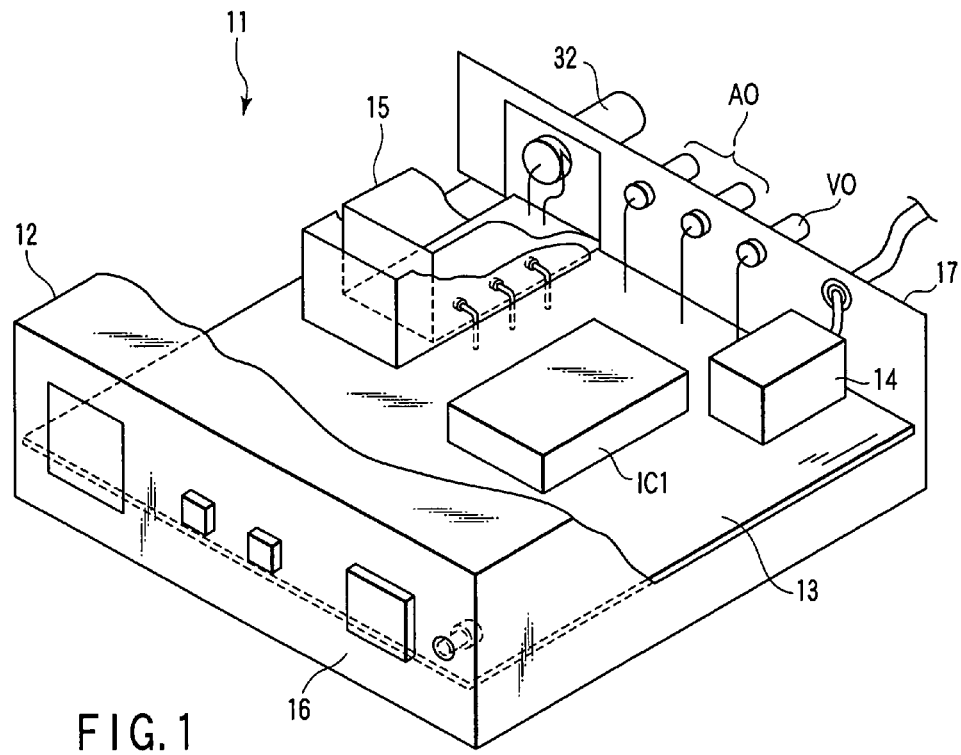
FIG. 1 is a partially cutaway view in perspective of a CATV terminal device according to a first embodiment of the present invention.

A first embodiment of the present invention will be described below in detail with reference to the accompanying drawings. FIG. 1 shows a CATV terminal device of the first embodiment.

The CATV terminal device, generally indicated at 11, is connected to a network using a CATV line and allows a subscriber to receive video programs, music programs, or character data over the network.

The CATV terminal device 11 allows information entered by the subscriber to be transmitted to the transmitting CATV center station.

Video programs, audio programs or character data are transmitted from the CATV center station to the CATV terminal device 11 via down signals of high frequencies of the order of, for instance, 90 to 860 MHz. Information is transmitted from the CATV terminal device 11 to the CATV center station via up signals of high frequencies of the order of, for instance, 5 to 65 MHz.

As shown in FIG. 1, the CATV terminal device 11 includes an outer case 12, a main circuit board 13, a power supply circuit board 14, a cable modem module 15, a front panel 16, and a rear panel 17.

The main circuit board 13 has the cable modem module 15 mounted on it. On the main circuit board 13 is also mounted a signal processing chip IC1 that produces a video signal, an audio signal or character data based on the output of the cable modem module 15.

On the front panel 16 are mounted a display unit which indicates the presence or absence of incoming mail or the like from a receive channel or CATV center station, a power switch, a phono jack for audio output, a light receiving unit adapted to receive operating information from a remote controller, and so on.

On the rear panel 17 are mounted a video output terminal VO adapted to output a video signal to a display unit, such as a cathode ray tube (CRT), audio output terminals AO adapted to output audio signals to the display unit or a sound reproducing system, an alternating current (AC) line adapted to supply commercial electric power to the power supply circuit board 14, an RF coaxial connector 32 provided in the cable modem module 15, and so on.

Here, the cable modem module 15 has functions of controlling communication with the CATV center station, producing up signals to be transmitted to the CATV center station, demodulating down signals transmitted from the CATV center station, and controlling data communications with external equipment connected to it. The cable modem module 15 also has a power supply function.

FIG. 2 shows the signal processing system of the cable modem module 15, which comprises a tuner unit 19 having an analog signal processing unit that transmits or receives high-frequency signals to or from a CATV center station 18 via the RF connector 32 and processes them and a digital signal processing unit DP that digital-processes signals input to or output from the tuner unit 19.

The digital signal processing unit DP includes an analog-to-digital converter (ADC) 20 adapted to convert down signals frequency-converted by the tuner unit 19 into digital signals and a demodulator 21 that demodulates the digital down signals to recover data. The demodulated down signals are applied to a media access control (MAC) unit 22.

Digital up signals produced by the MAC unit 22 are converted into analog signals by a digital-to-analog converter (DAC) 23 and then transmitted to the CATV center station 18 through the tuner unit 19.

The MAC unit 22 has a function of sending data transmitted to or received from the CATV center station 18 with external equipment 24 connected to the cable modem module 15.

That is, to the down-side data input/output terminal is connected an media independent interface (MII) 25, which is in turn connected to a selector 26 so as to allow a direct input/output operation on the cable modem module 15.

The MII 25 is also connected to an Ethernet interface 27, which has its down-side data input/output terminal connected to the selector 26.

The MAC unit 22 is also connected to a USB interface 28, which is in turn connected to the selector 26.

The selector 26 selectively connects the MII 25, the Ethernet interface 27, or the USB interface 28 to the external equipment 24 for data communications.

The cable modem module 15 has a main control unit 29 with a built-in microcomputer adapted to control the operation of the respective circuits including the tuner unit 19 and an IC memory 30. The main control unit 29 and the IC memory 30 are connected to the MAC unit 22.

The circuits including the tuner unit 19 are supplied with electric power from the outside of the cable modem module 15.

Figure 3:
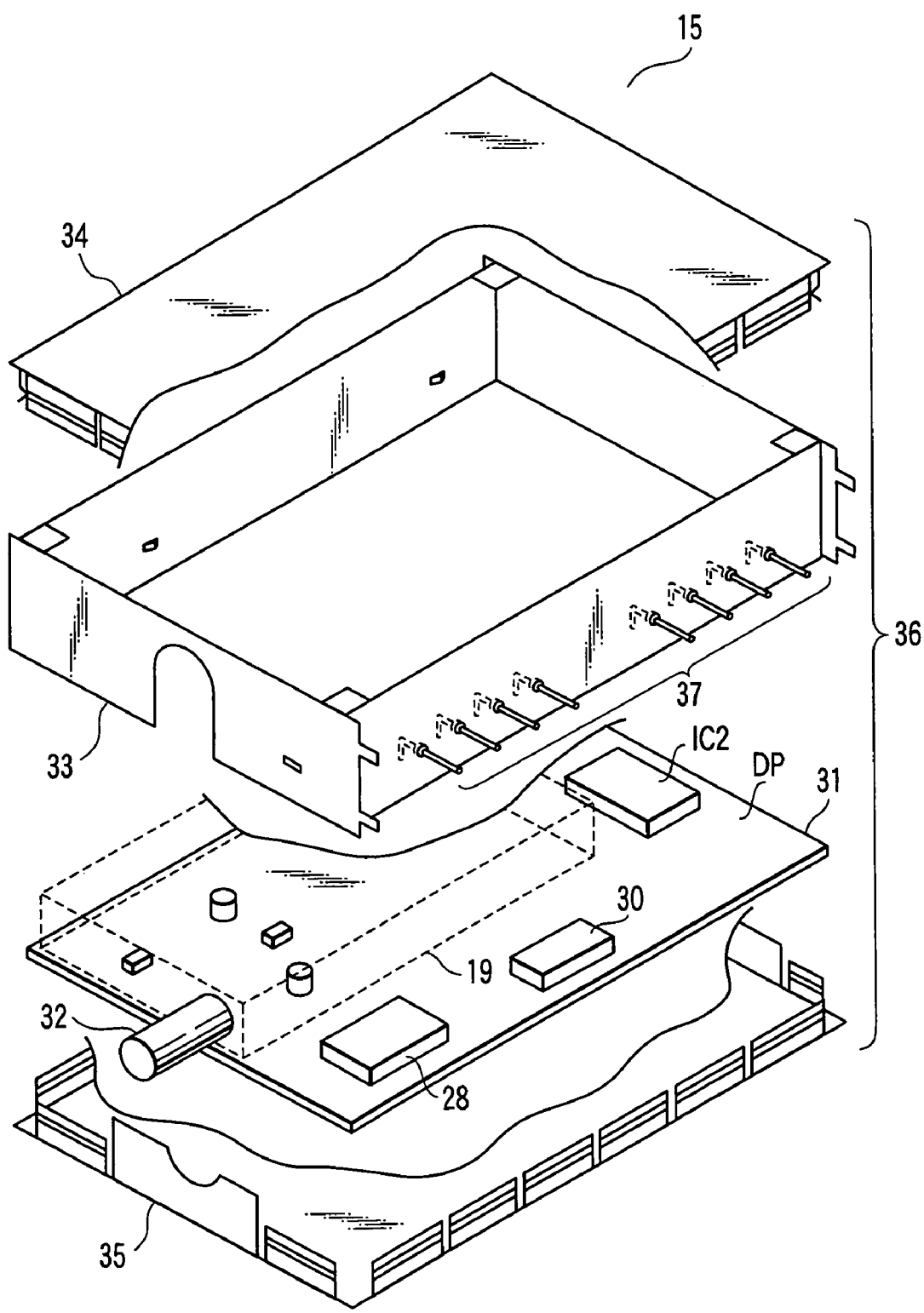
FIG. 3 is an exploded perspective view, with portions broken away, illustrating the structure of the cable modem module.

FIG. 3 shows the structure of the cable modem module 15. In this diagram, reference numeral 31 denotes a circuit board on which the tuner unit 19 and the digital signal processing unit DP shown in FIG. 2 are mounted.

The tuner unit 19 is equipped with an RF coaxial connector 32 for connection to a CATV trunk line. The RF coaxial connector 32 is connected to the tuner unit 19 mounted on the circuit board 31.

The digital signal processing unit DP is constructed by mounting a semiconductor chip IC2 into which the ADC 20, the demodulator 21, the MAC unit 22, the DAC 23, MII 25, the Ethernet interface 27 and the main control unit 29 are integrated, the USB interface 28 in the form of a semiconductor chip, and the IC memory 30 on the circuit board 31.

The cable modem module 15 includes a shield case 36 which has the shape of a hexahedron or the like and is composed of a four-sided metal case 33, which encloses the four sides of the circuit board 31 which are perpendicular to its surface and shields from external electromagnetic waves, a first cover 34 which covers one of the openings of the four-sided metal case 33 and shields against external electromagnetic waves, and a second cover 35 which covers the other opening of the metal case 36 and shields against external electromagnetic waves.

The metal case 33 is equipped with terminals 37 for communication with the digital signal processing unit DP of the cable modem module 15 and power supply thereto. As the terminals 37 use is made of terminals, such as through capacitors, which can be directly soldered to another external circuit board (in this case the main circuit board 13), or terminals which can be connected by means of connectors of simple structure. Each of the terminals 37 has its one end connected to the circuit board 31 and its other end made to pass through the metal case 33 and project to outside.

The terminals 37 includes a terminal which makes connection between one of the MII 25, the Ethernet interface 27 and the USB interface 28 selected by the selector 26 and the external equipment 24.

Thus, the six sides of the circuit board 31 are enclosed by the metal case 33 and the first and second covers 34 and 35, and the terminals 37, such as through capacitors, which can be directly soldered to the main circuit board 13 are made to have a function of communication with any one of the MII 25, the Ethernet interface 27 and the USB interface 28.

Thereby, the cable modem module 15 can be mounted on the main circuit board 13 so that communication with the external equipment 24 can be made through the main circuit board 13 and the terminals 37.

When the terminals 37 are through capacitors, cost can be reduced significantly in comparison with the case where Ethernet connectors or jacks or USB connectors or jacks are used.

Using through capacitors as the terminals 37 and directly soldering the terminals to the main circuit board 13 will not require an expensive cable, such as an Ethernet cable or a USB cable. Without a long cable, unwanted radiation from another PC can be reduced and good communication quality can be achieved. The total cost including the cable modem module 15 can also be reduced.

The use of through capacitors allows designs to be made in which high-frequency characteristics are sufficiently allowed for. For example, the pickup of unwanted signals can be reduced.

The use of the selector 26 for making a selection from communication functions eliminates the need of providing the terminals 37 with one terminal for each of the communication functions, allowing the number of terminals to be decreased and the size and cost to be reduced.

The selector 26 may be an electronic switch composed of transistors or FETs, a mechanical switch using relays, or other means for selecting signals depending upon whether or not a connection-enabling member is installed at the time of manufacture.

It is possible to selectively mount the MII 25, the Ethernet interface 27, or the USB interface 28 on the circuit board 31 at manufacture time for connection to the terminals 37 while at the same time the circuit board 31 is designed so that the MII 25, the Ethernet interface 27, and the USB interface 28 can be mounted on it.

In this way, parts for a communication function which is not needed are not required to be mounted and the selector 26 as well becomes unnecessary. In addition, even if any communication function is selected, the circuit board 31 can be used in common, allowing the cost of the cable modem module 15 to be reduced.

A second embodiment of the present invention will be described next with reference to FIG. 4. In this diagram, parts corresponding to those in FIG. 3 are denoted by like reference numerals. That is, the tuner unit 19 is constructed so that its circuit board 38 on which circuits are formed is housed in a shield case 39 made of a material, such as a metal, that has an effect of preventing or reducing the penetration of unwanted radiation of electromagnetic waves.

The tuner unit 19 is provided with terminals 40 adapted to input and output analog signals, each of the terminals having its one end connected to the tuner circuit board 38 and its other end made to pass through the shield case 39 and project to outside. The tuner unit 19 is connected to the digital signal processing unit DP mounted on the circuit board 31 by connecting the other ends of the terminals 40 to the circuit board 31.

The terminals 40 of the tuner unit 19 and the terminals 37 of the metal case 33 are located in opposite positions on the circuit board 31 in order to maintain the greatest possible distance between the terminals 37 and 40.

In general, analog signals handled by the tuner unit 19 and the terminals 40 are often small in magnitude. Because of analog signals, the superimposition of unwanted signals on them may degrade communication quality.

In contrast, signals handled by the terminals 37 of the metal case 33 are fast digital signals which are input to or output from the cable modem module 15 through the Ethernet, USB, or MII. The fundamental-frequency component and harmonic components of the digital signals act as the very source of noise and unwanted signals on the analog signals handled by the terminals 40.

The digital signals are often very large in magnitude compared to the analog signals handled by the terminals 40. The difference in magnitude will greatly degrade the communication quality if the terminals 40 suffer noise and unwanted signals resulting from unwanted radiation from the terminals 37.

In particular, signals output from the DAC 23 and input to the tuner unit 19 through the terminals 40 and signals received by the tuner unit 19 and applied to the ADC 20 through the terminals 40 may fail to satisfy the standards of the cable modem module 15 and degrade the receiving performance when the terminals 40 suffer unwanted radiation from the terminals 37.

Figure 4:
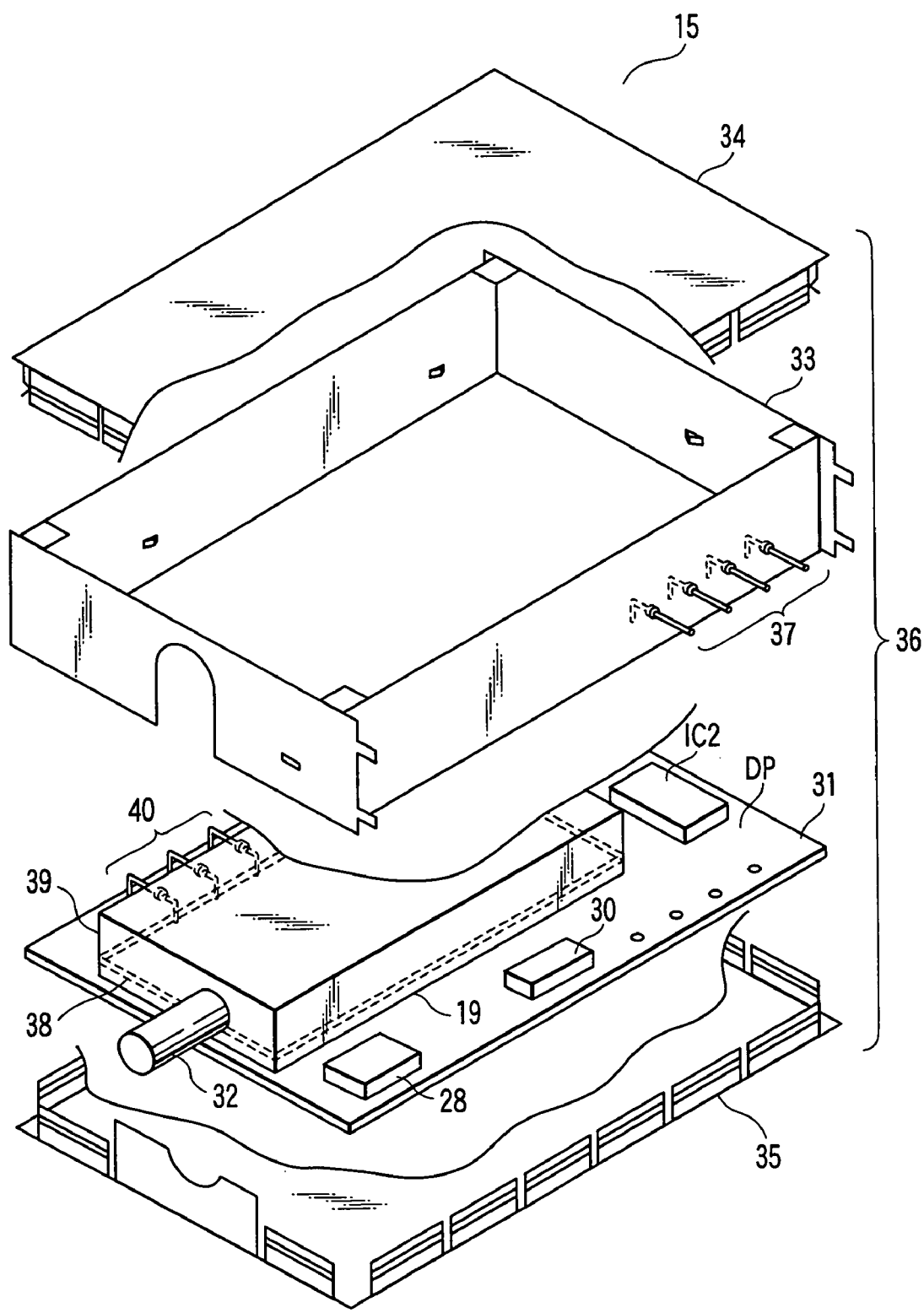
FIG. 4 is an exploded perspective view, with portions broken away, illustrating the structure of a cable modem module according to a second embodiment of the present invention.

According to the second embodiment shown in FIG. 4, the terminal group 37 and the terminal group 40 are located as far apart from each other as possible on the circuit board 31, allowing the magnitude of noise and unwanted signals resulting from unwanted radiation from the terminals 37 on the terminals 40 to be minimized and the effect of the noise and unwanted signals to be reduced. As a result, the quality of signals handled by the terminals 40 can be kept good, allowing the tuner unit 19 to make high-quality communication with the CATV center station 18.

Figure 5:
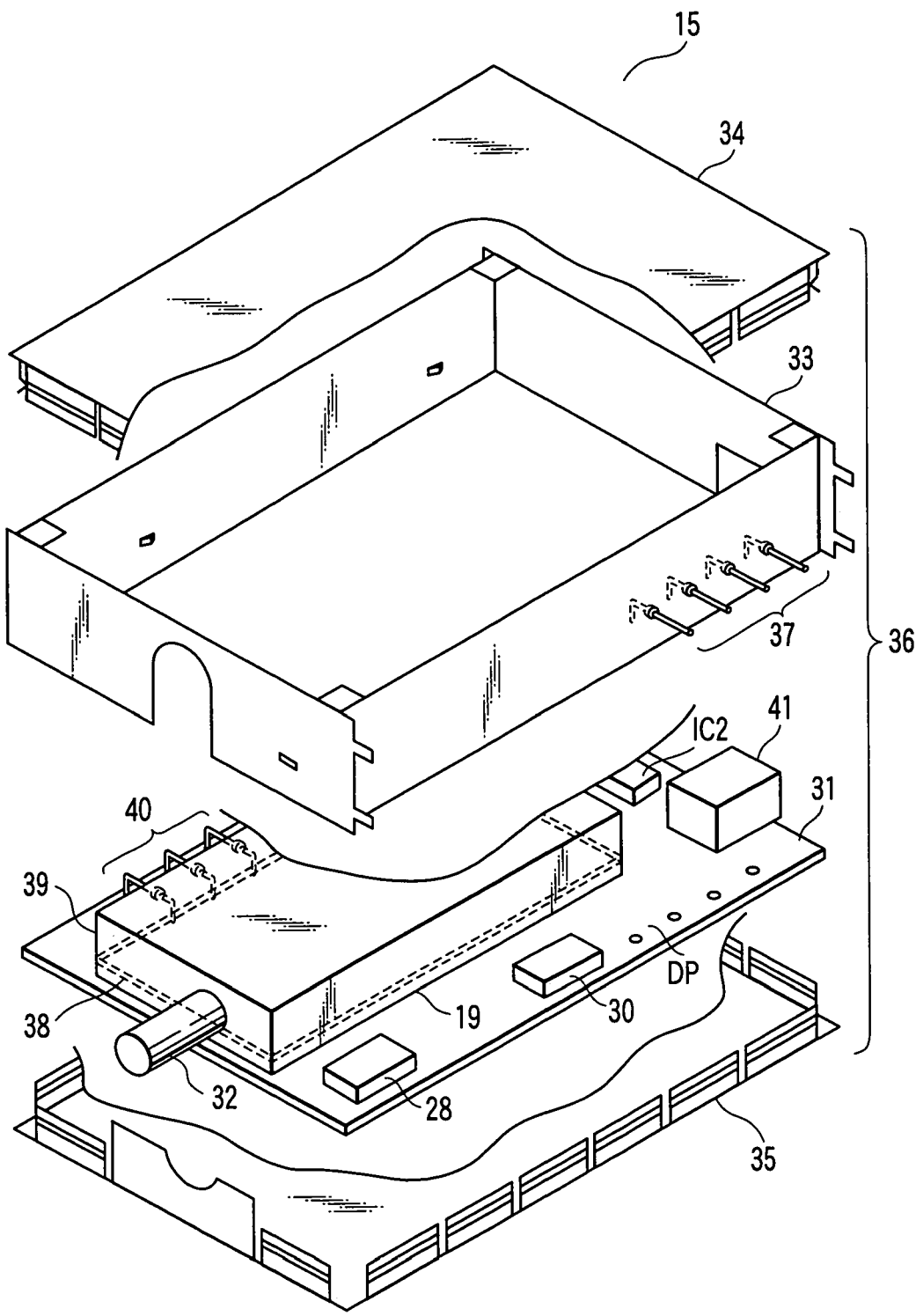
FIG. 5 is an exploded perspective view, with portions broken away, illustrating a modification of the cable modem module of the second embodiment.

Although the terminals 37 are comprised of terminals, such as through capacitors, which have a filter function of attenuating noise and unwanted signals, a standard interface connector 41 that conforms to the Ethernet and USB standards can also be used for digital communications with outside as shown in FIG. 5. In this case, the terminals 40 and the standard interface connector 41 are mounted in opposite positions on the circuit board 31.

Figure 7:
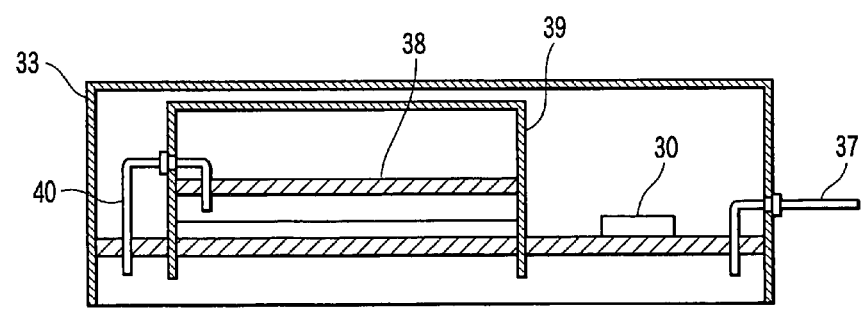
FIG. 7 is a cross-sectional side view of the cable modem module of the third embodiment.

A third embodiment of the present invention will be described with reference to FIGS. 6 and 7 in which parts corresponding to those in FIG. 4 are denoted by like reference numerals. In this embodiment, the terminals 40 of the tuner unit 19 are located in a position close to one side of the circuit board 31, while the IC memory 30 is located in a position close to the other side opposite the one side.

Namely, the distance between the terminals 40 and the IC memory 30 is set as great as possible. As with the terminals 37 for digital communications, fast digital signals are input to or output from the IC memory 30 as well. As with the digital signals handled by the terminals 37, the digital signals of the IC memory 30 will adversely affect the signals handled by the terminals 40 of the tuner unit 19.

Figure 6:
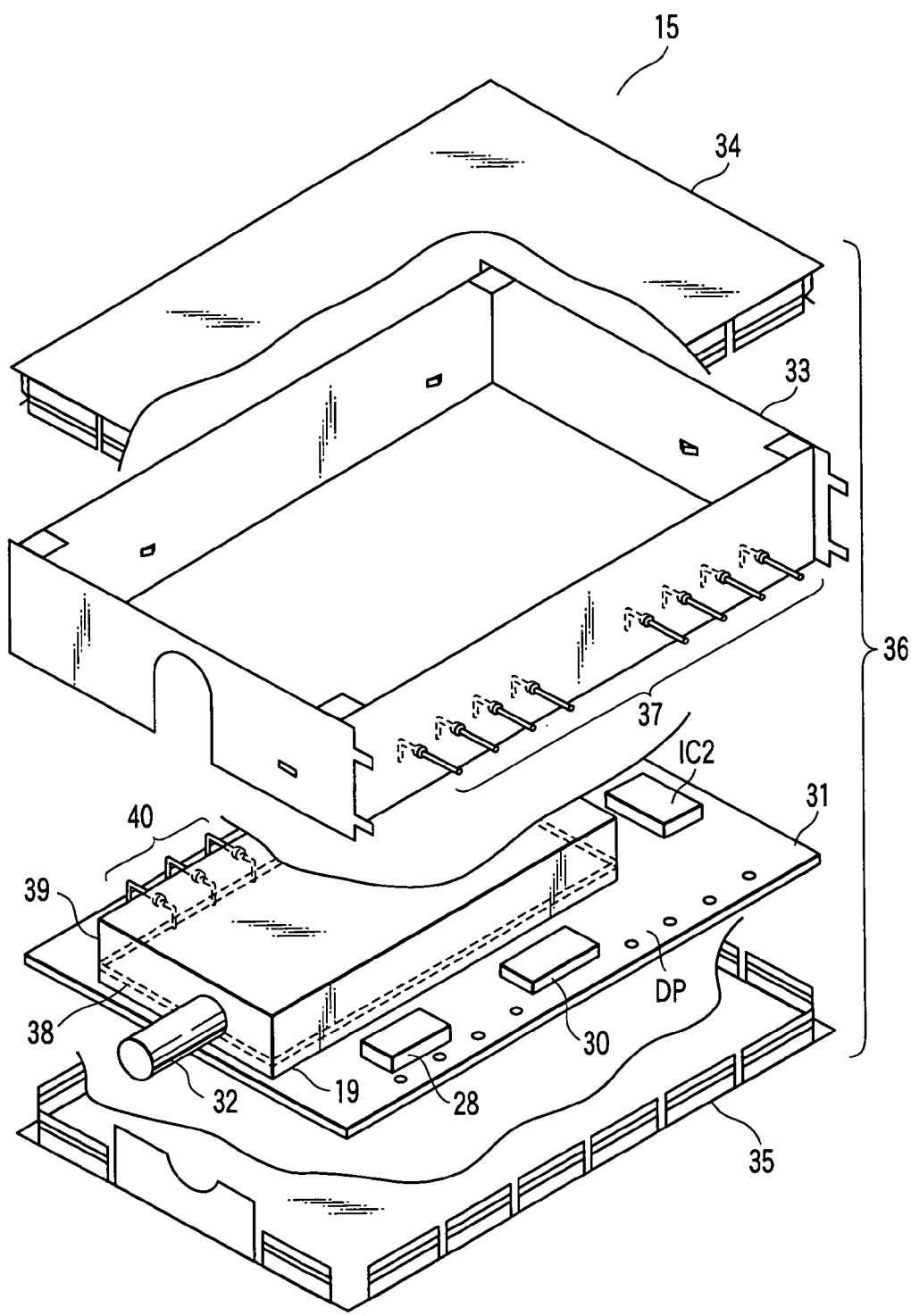
FIG. 6 is an exploded perspective view, with portions broken away, illustrating the structure of a cable modem module according to a third embodiment of the present invention.

According to the third embodiment shown in FIG. 6, keeping the IC memory 30 and the terminals 40 as far apart from each other as possible allows the pickup of noise and unwanted signals resulting from unwanted radiation to be minimized and the resulting effect to be lessened. As a result, the quality of signals handled by the terminals 40 can be kept good, thereby allowing the tuner unit 19 to make high-quality communication with the CATV center station 18.

The IC memory 30 and the terminals 40 may be located not only on the opposed sides of the circuit board 31 but also at the opposite corners. Furthermore, the IC memory 30 and the terminals 40 can also be located on the circuit board 31 with the shield case 39 of the tuner unit 19 interposed therebetween.

In addition, by keeping not only the IC memory 30 but also parts that handle digital signals (i.e., the digital signal processing unit, such as the MII 25, the Ethernet interface 27, the USB interface 28, etc.) away from the terminals 40, the adverse effect on the analog signals handled by the tuner unit 19 can be reduced.

A fourth embodiment of the present invention will be described with reference to FIGS. 8 and 9 in which parts corresponding to those in FIGS. 2 and 3 are denoted by like reference numerals. In this embodiment, to the main control unit 29 is connected a Joint Action Test Group (JTAG) or enhanced JTAG (EJTAG) interface terminal 42 corresponding to the JTAG protocol (IEEE 1149.1) that conforms to the JTAG standards.

The interface terminal 42 is connected to a PC and allows the main control unit 29 to make communication with the PC in order to perform tests on software of the cable modem module 15 for debugging, setup and verification. The terminal 42 is used at the time the cable modem module 15 is manufactured and is not intended for use by users after manufacture.

Figure 9:
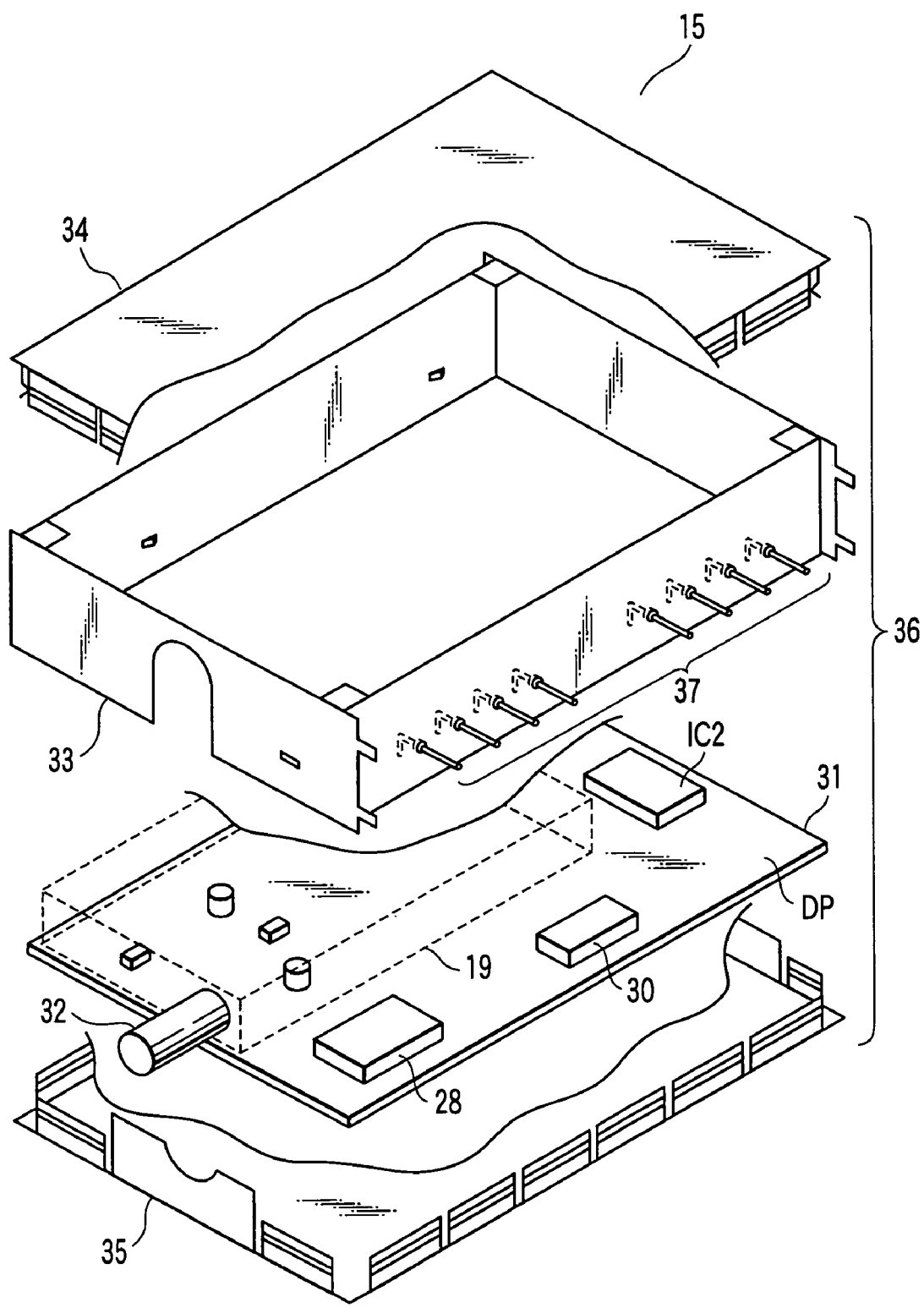
FIG. 9 is an exploded perspective view, with portions broken away, illustrating the structure of the cable modem module of the fourth embodiment.

The terminal 42 is included among the terminals 37 attached to the metal case 33 as shown in FIG. 9. For this reason, by connecting a PC to one of the terminals 37 which corresponds to the terminal 42 to allow it to communicate with the microcomputer in the main control unit 29, the software of the cable modem module 15 can be debugged, set up, and verified.

In this case, the terminals 37 will be exposed to the outside of the cable modem module 15. In an as-shipped product, however, the cable modem module 15 itself has been built into the outer case 12 of the CATV terminal device 11 as shown in FIG. 1; therefore, it is impossible for users to access the microcomputer of the main control unit 29 through the terminals 37.

Thus, by including the JTAG or EJTAG interface terminal 42 among the terminals 37, even after the cable modem module 15 has been incorporated into the CATV terminal device 11 but before the outer case 12 is fixed in position, access can be made to the microcomputer of the main control unit 29 through the terminals 42. Even in the process of manufacture of the CATV terminal device 11, therefore, the software of the cable modem module 15 can be debugged, set up, and verified.

Even after the CATV terminal device 11 has been shipped, a customer engineer can remove the outer case 12 for service to debug, set up, and verify the software of the cable modem module 15.

Figure 8:
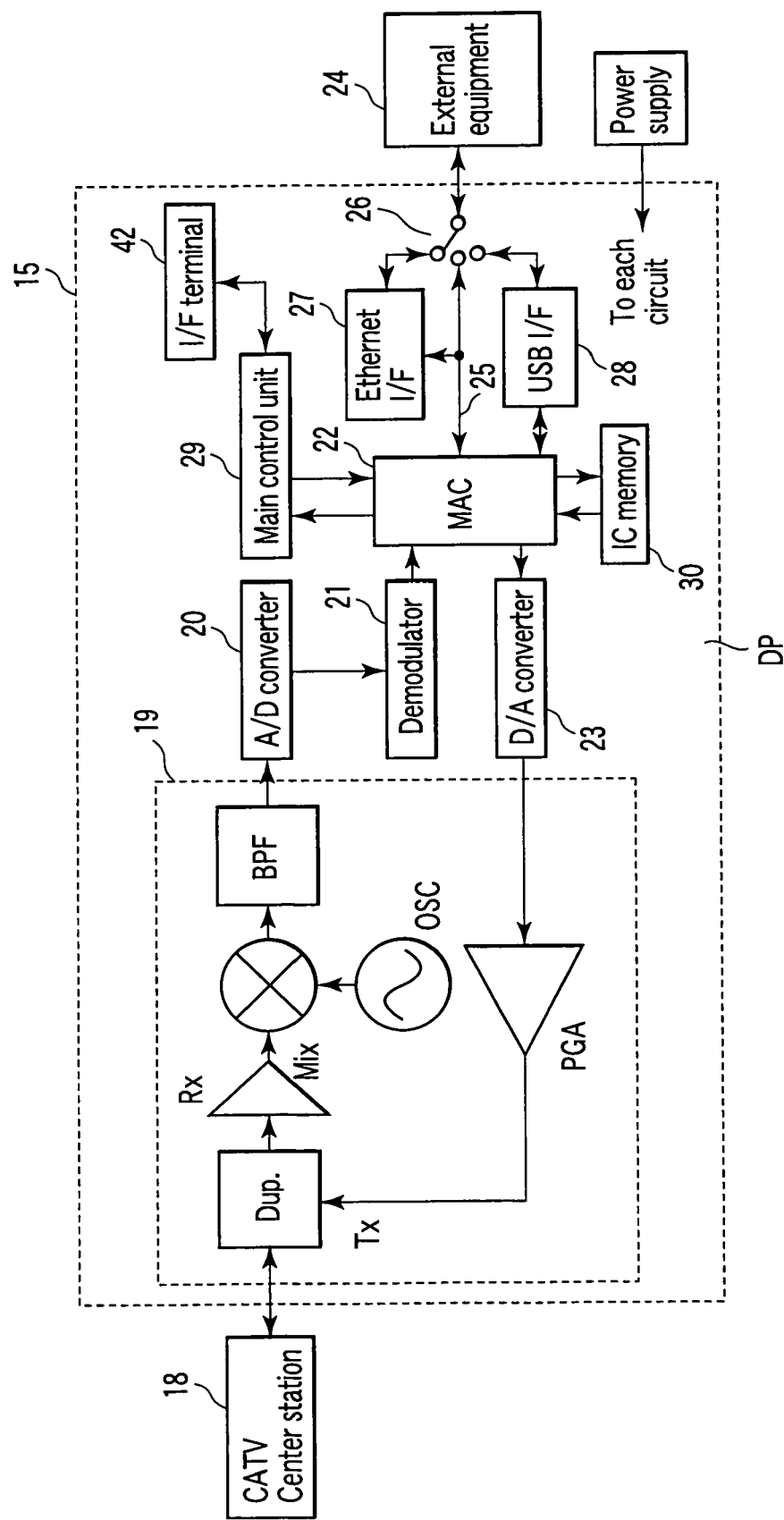
FIG. 8 is a block diagram of the signal processing system of a cable modem module according to a fourth embodiment of the present invention.
Figure 10:
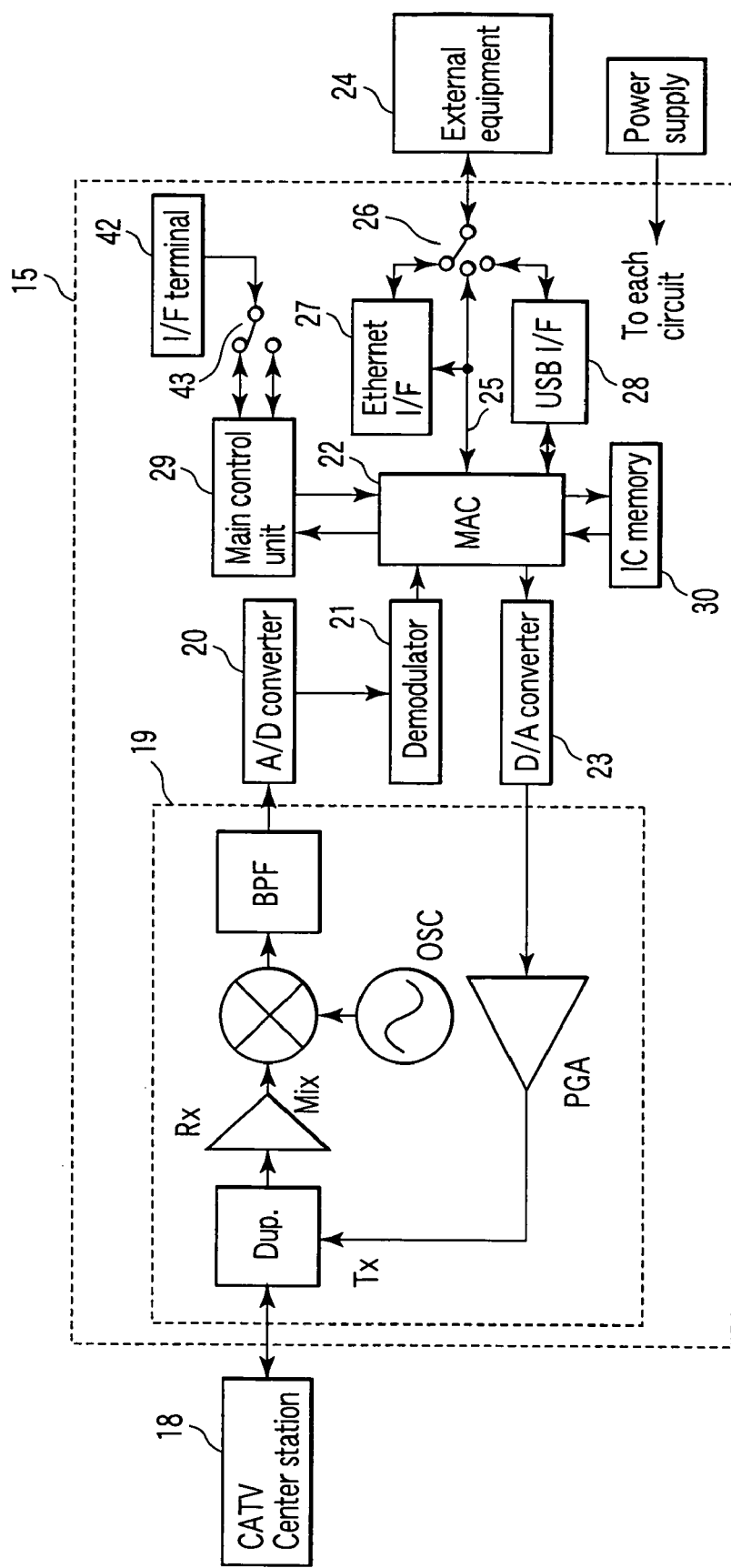
FIG. 10 is a block diagram of the signal processing system of a modification of the cable modem module of the fourth embodiment.

FIG. 10 shows a modification of the fourth embodiment shown in FIG. 8. That is, the main control unit 29 has interface functions for both the JTAG and EJTAG interfaces, each of which can be selectively connected to the interface terminal 42 through a selector 43.

The provision of the selector 43 allows either the JTAG or the EJTAG interface function to be selected freely. Since either of the interfaces can be selected using the same circuit board 31, the cable modem module 15 can be made inexpensive and easy to handle.

As the interface that connects to a PC in order to debug, set up and verify the software of the cable modem module 15, use may be made of, for example, a universal asynchronous receiver-transmitter (UART) besides JTAG and EJTAG. Such a configuration as allows a selection from among such three interfaces to be made freely is also possible.

A fifth embodiment of the present invention will be described next with reference to FIG. 11. In this embodiment, as shown in FIG. 11, the cable modem module 15 is configured such that the RF coaxial connector 32 attached to the shield case 36 to protrude therefrom is inserted into a through hole 17a formed in the rear panel 17 of the outer case 12 to project to the outside of the outer case 12.

The cable modem module 15 is mounted with a display device 44 comprised of, for example, an LED on the same side that the RF coaxial connector 32 is attached. The display device 44 is adapted to display a setting or operating condition of the cable modem module 15, for example, whether it is liked with the CATV center station 18, in other words, the signal processing state on the circuit board 31. The shield case 36 is formed with a window that allows the display device 44 to be recognized from the outside of the cable modem module 15.

The rear panel 17 of the outer case 12 is formed with a window 17b in that position which corresponds to the display device 44 in the state in which the RF coaxial connector 32 of the cable modem module 15 is passed through the through hole 17a. The user is therefore allowed to recognize the display state of the display device 44 through the window 17b.

Figure 11:
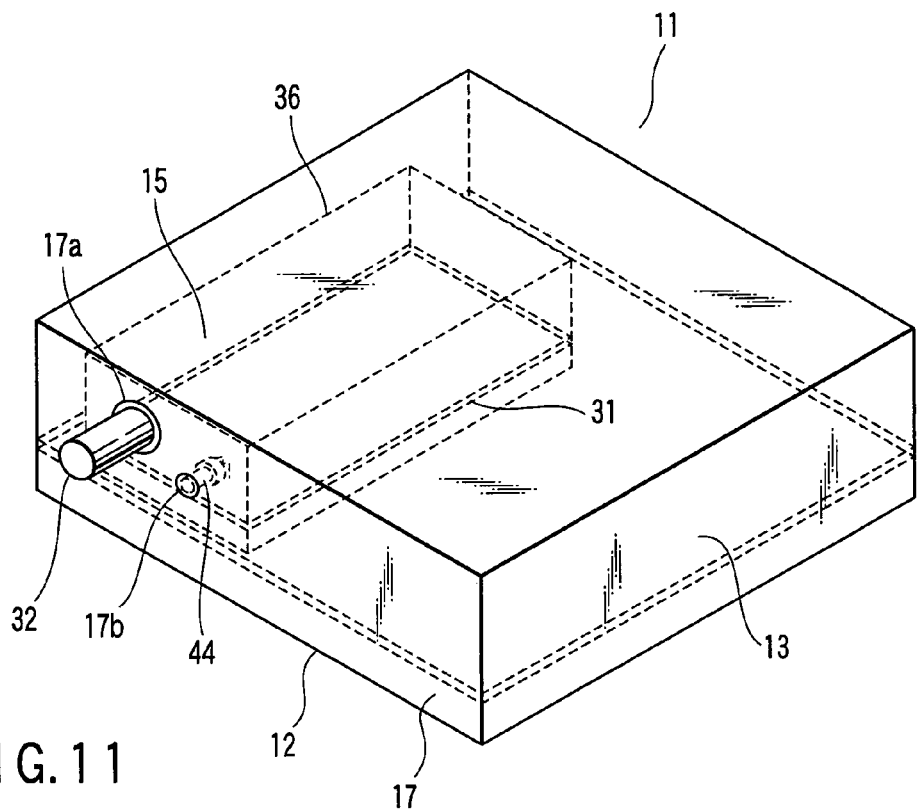
FIG. 11 is a perspective view illustrating a relationship between a CATV terminal device and a cable modem module according to a fifth embodiment of the present invention.

According to the fifth embodiment shown in FIG. 11, since the shield case 36 of the cable modem module 15 is provided with the display device 44 on its side through which the RF coaxial connector 32 is passed, the display device 44 will inevitably look toward the rear panel 17 when the RF coaxial connector 32 is set to project to outside through the rear panel 17.

For this reason, it is required only that the window 17b be formed in the rear panel 17 in the position corresponding to the display device 44. In other words, only the rear panel 17 of the cable modem module 15 needs to be processed, which is effective in manufacture.

The window formed in the shield case 36 and the window 17b formed in the rear panel 17 may be simply openings or may be formed by filling the openings with transparent resin.

Figure 12:
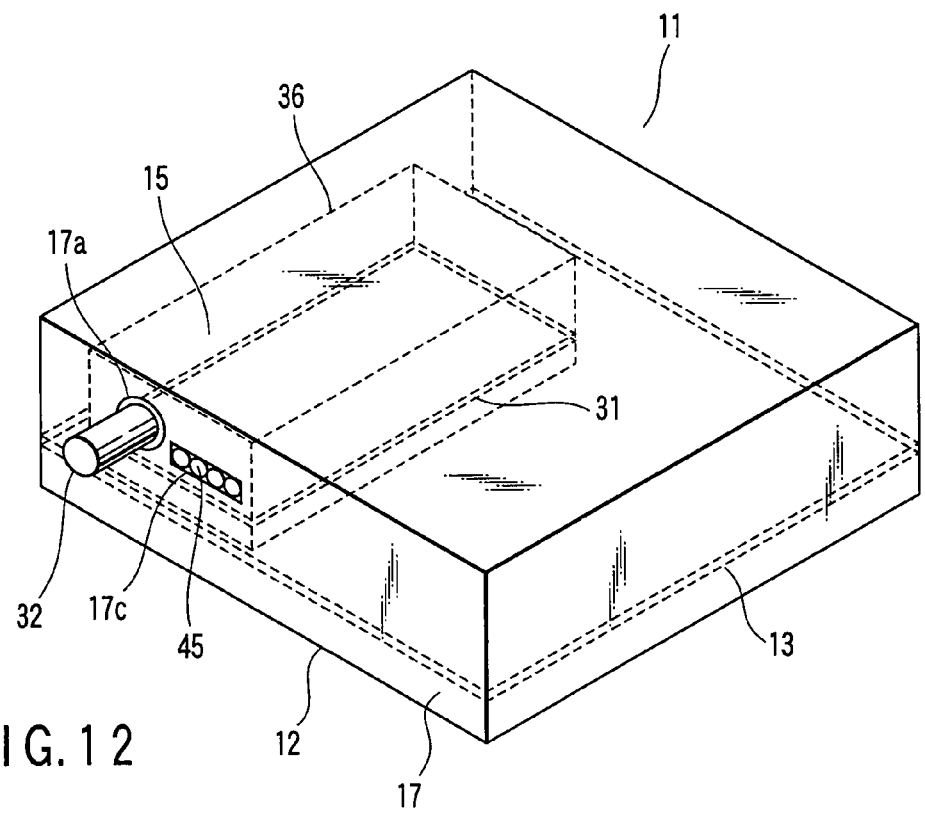
FIG. 12 is a perspective view illustrating a relationship between a CATV terminal device and a cable modem module according to a sixth embodiment of the present invention.

A sixth embodiment of the present invention will be described next with reference to FIG. 12. In this embodiment, as shown in FIG. 12, a label 45 indicating a MAC address is attached to that side of the shield case 36 of the cable modem module 15 through which the RF coaxial connector 32 is passed.

The MAC address is uniquely set up on the cable modem module 15 in order to identify the host on a network for the purpose of controlling communication between the CATV center station 18 and the cable modem module 15. That is, the MAC address is a globally unique hardware address. On the label 45 the MAC address is printed in the form of a number or bar code.

The rear panel 17 of the outer case 12 is formed with a window 17c in that position which corresponds to the label 45 in the state in which the RF coaxial connector 32 of the cable modem module 15 is passed through the through hole 17a. The user is therefore able to recognize the MAC address from the outside of the CATV terminal device 11.

In the six the embodiment as well, it is required only that the window 17c be formed in the rear panel 17 in the position corresponding to the label 45. In other words, only the rear panel 17 of the cable modem module 15 needs to be processed, which is effective in manufacture. This window 17c may also be simply an opening or may be formed by filling the opening with transparent resin.

Although the embodiments have been described so far in terms of the CATV terminal device 11 as a transmitter-receiver having the cable modem module 15 built in, the present invention is also applicable to, for example, a game machine as a transmitter-receiver.

Figure 13:
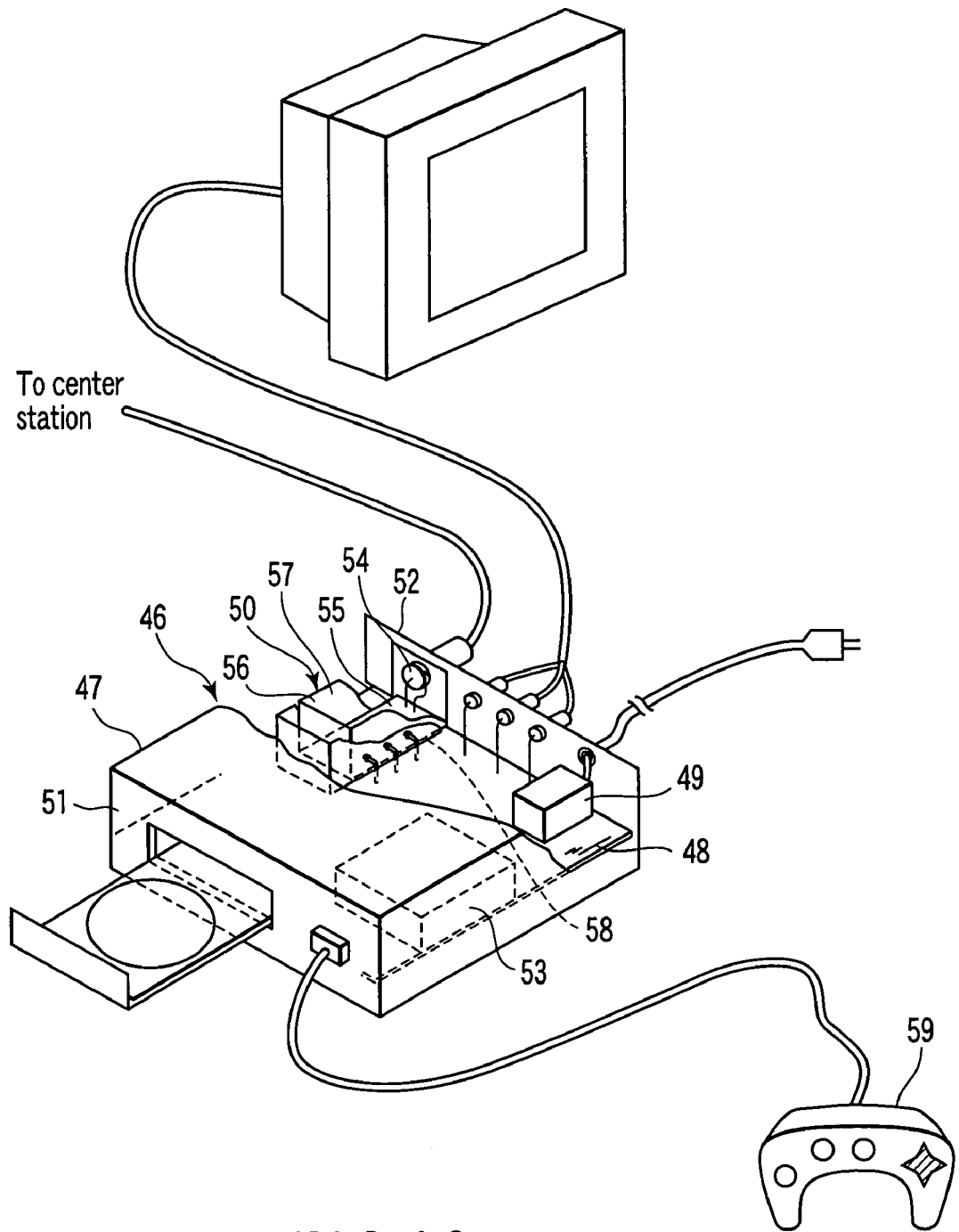

For example, such a game machine 46 as shown in FIG. 13 includes an outer case 47, a main circuit board 48, a power supply circuit board 49, a cable modem module 50, a front panel 51, and a rear panel 52. A controller 59 is connectable to the front panel 51.

The game machine 46 includes a hard disk drive (HDD) 53 which can store game software applications, the latest versions of data, high-score data, etc., which are downloaded from the center station, and a communication unit which allows communication with a competitor entered in the center station for competitive fighting games to be established or cut off.

To provide for a case where the main portion of game software is supplied through a disk medium that conforms to the DVD standards or a storage medium (a cartridge or card) that meets a specific standard, the game machine may be provided with a disk drive and a card (cartridge) slot.

Though not described in detail, a cable modem module 50 having an RF coaxial connector 54 attached to its circuit board 55 is fixed in position to the main circuit board 48 as in the example of FIG. 3 or 4.

Since the cable modem module 50 is shielded by a metal case 56, an upper case 57, and a lower case 58, incoming unwanted radiation to the circuit board 55 or outgoing unwanted radiation from the circuit board is reduced.

Accordingly, the use of the inventive cable modem module (shield mechanism) allows signals of high quality to be transmitted and received.

The present invention is not limited to the embodiments described above. As the stage of practice of the invention, constituent elements can be variously modified without departing from the scope and spirit thereof. The constituent elements disclosed in the above embodiments can be combined appropriately to form various inventions. For example, some components may be removed from all the constituent elements shown in the embodiments. In addition, the constituent elements in the different embodiments may be combined appropriately.

What is claimed is:

1. A cable modem module comprising:
a tuner unit configured to have an analog signal processing unit to transmit and receive high-frequency signals;
a first shield case configured to house the tuner unit;
a first terminal used to input and output analog signals and configured such that its one end is connected to the tuner unit and its other end is passed through the first shield case to project to outside;
a circuit board having the other end of the first terminal connected to it and configured to have a digital signal processing unit to digital process signals to be input to or output from the tuner unit;
a second shield case configured to house the circuit board and the first shield case; and
a plurality of second terminals each terminal having its one connected to the circuit board and its other end passed through the second shield case to project to outside and configured to input or output digital signals to or from the digital signal processing unit, each of the second terminals being comprised of a through capacitor.

2. A cable modem module according to claim 1, wherein the second terminals includes a transmitting/receiving terminal for digital communication.

3. A cable modem module according to claim 2, wherein the digital communication is performed through a communication function of one of MII, Ethernet, and USB.

4. A cable modem module according to claim 3, further comprising a plurality of interfaces respectively corresponding to communication functions of MII, Ethernet, and USB and a selector configured to selectively connect one of the interfaces to the transmitting/receiving terminal.

5. A cable modem module according to claim 1, wherein the first terminal and at least some of the second terminals are located in opposite positions on the circuit board.

6. A cable modem module according to claim 1, further comprising a digital interface connector located on the circuit board apart from the first terminal and configured to input digital signals to or output such signals from the digital signal processing unit.

7. A cable modem module according to claim 1, wherein each of the first terminal and a memory to input or output digital data to or from the digital signal processing unit is located in the neighborhood of a respective one of the opposite sides of the circuit board.

8. A cable modem module according to claim 1, wherein the second terminals include a test terminal used to test the digital signal processing unit from the outside of the second shield case.

9. A cable modem module according to claim 8, wherein the digital signal processing unit includes a plurality of interfaces adapted for testing purpose and a selector configured to selectively connect one of the interfaces to the test terminal.

10. A cable modem module according to claim 1, wherein the analog signal processing unit transmits or receives high-frequency signals through a coaxial connector which is passed through the first shield case to project to outside, the second shield case has a side through which the coaxial connector is passed, and at least one of a first display configured to indicate a signal processing state on the circuit board and a second display configured to indicate an identification address unique to the cable modem module is provided on the side of the second shield case through which the coaxial connector is passed.

11. A transmitter-receiver comprising:
a cable modem module comprising a tuner unit configured to have an analog signal processing unit to transmit and receive high-frequency signals, a first shield case configured to house the tuner unit; a first terminal used to input and output analog signals and configured such that its one end is connected to the tuner unit and its other end is passed through the first shield case to project to outside; a circuit board having the other end of the first terminal connected to it and configured to have a digital signal processing unit to digital process signals to be input to or output from the tuner unit; a second shield case configured to house the circuit board and the first shield case; and a plurality of second terminals each terminal having its one connected to the circuit board and its other end passed through the second shield case to project to outside and configured to input or output digital signals to or from the digital signal processing unit, each of the second terminals being comprised of a through capacitor; and a power supply unit configured to supply electric power to the cable modem module, the cable modem module being operated from electric power supplied from the power supply unit to transmit or receive signals to or from outside.

* * * * *